(12) United States Patent
Ray et al.

(10) Patent No.: US 6,399,271 B1
(45) Date of Patent: Jun. 4, 2002

(54) PLANOGRAPHIC PRINTING

(75) Inventors: Kevin Barry Ray, Morley; Mark John Spowage, West Yorkshire, both of (GB); Christopher David McCullough, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/517,846

(22) Filed: Mar. 2, 2000

Related U.S. Application Data

(63) Continuation of application No. PCT/GB98/02817, filed on Sep. 17, 1998.

(30) Foreign Application Priority Data

Sep. 17, 1997 (GB) .............................. 9719644

(51) Int. Cl.$^7$ .................. G03C 1/735; G03C 1/76; G03F 7/09; G03F 7/213; G03F 7/30

(52) U.S. Cl. .................. 430/270.1; 430/302; 430/303; 430/328; 430/909; 430/911; 430/905; 430/271.1; 101/456; 101/467; 101/463.1

(58) Field of Search .................. 430/302, 303, 430/328, 909, 911, 905, 270.1, 271.1; 101/453, 454, 456, 457, 458, 465, 466, 467

(56) References Cited

U.S. PATENT DOCUMENTS

| | | | |
|---|---|---|---|
| 3,606,922 A | 9/1971 | Doggett | 156/329 |
| 3,890,149 A | 6/1975 | Schlesinger et al. | 96/33 |
| 3,905,816 A | 9/1975 | Boardman et al. | 96/33 |
| 4,225,663 A | 9/1980 | Ball | 430/303 |
| 4,292,397 A * | 9/1981 | Takeuchi et al. | 430/303 |
| 4,347,303 A * | 8/1982 | Asano et al. | 430/272.1 |
| 4,571,382 A * | 2/1986 | Adachi | 435/7 |
| 4,617,579 A | 10/1986 | Sachdev et al. | 346/135.1 |
| 5,621,038 A | 4/1997 | Chen et al. | 524/547 |
| 5,827,922 A | 10/1998 | Chen et al. | 524/837 |

FOREIGN PATENT DOCUMENTS

| | | |
|---|---|---|
| EP | 0028137 | 6/1981 |
| GB | 1399949 | 7/1975 |
| WO | 9323794 | 11/1993 |
| WO | 9707986 | 3/1997 |
| WO | 9736208 | 10/1997 |

OTHER PUBLICATIONS

English Translation of JP 55-124149 (Tomio et al.) which was Cited as "X" Ref in the European Search Report, Sep. 25, 1980.*

Patent Abstracts of Japan Publication No. 55124149, Sep. 25, 1980, 1 page.

Patent Abstracts of Japan Publication No. 58060744, Apr. 11, 1983, 1 page.

Patent Abstracts of Japan Publication No. 59048768, Mar. 21, 1984, 1 page.

* cited by examiner

*Primary Examiner*—Janet Baxter
*Assistant Examiner*—Sin J. Lee
(74) *Attorney, Agent, or Firm*—Baker Botts L.L.P.

(57) ABSTRACT

A planographic printing member precursor comprises a first component, for example a hydroxy group containing polymer, and a second component which may be a siloxane or a compound of general formula (I):

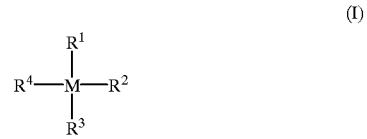

wherein M represents a silicon or a titanium atom and each of $R^1$, $R^2$, $R^3$ and $R^4$ is independently selected from hydrogen or halogen atoms; a hydroxy group, an optionally substituted alkyl, alkenyl or alkynyl group; an optionally substituted alkoxy group; or an optionally substituted saturated or unsaturated cyclic or heterocyclic group. On exposure, the second component reacts with the first component to define an oleophobic/hydrophilic material in exposed areas and in non-exposed areas the second component is removed, on processing of the precursor.

19 Claims, No Drawings

PLANOGRAPHIC PRINTING

CROSS REFERENCE TO RELATED APPLICATIONS

This is a continuation of copending international application Ser. No. PCT/GB98/02817 filed Sep. 17, 1998, which was published in English on Mar. 25, 1999, and which in turn claims priority from GB Application No. 9719644.8 filed Sep. 17, 1997.

This invention relates to planographic printing and provides a planographic printing member precursor, a method of preparing a planographic printing member and such a printing member per se.

Planographic and/or lithographic processes involve establishing image (printing) and non-image (non-printing) areas on a substrate, substantially on a common plane. When such processes are used in printing industries, non-image areas and image areas are arranged to have different affinities for printing ink. For example, non-image areas may be generally hydrophilic or oleophobic and image areas may be oleopohilic. In "wet" lithographic printing, a dampening or fountain (water-based) liquid is applied initially to a plate prior to application of ink so that it adheres to the non-image areas and repels oil based inks therefrom. In "dry" printing, ink. is repelled from non-image areas due to their release property.

There are numerous-known processes for creating image and non-image areas. Some processes rely on the differential solubility of exposed and non-exposed areas in a developer; others use incident radiation to break covalent bonds of radiation sensitive formulations or to ablate a layer of material.

It is an object of the present invention to provide a novel planographic printing member precursor and/or method of preparing the same and/or method of preparing a printing member and/or such a printing member per se.

According to the present invention, there is provided a planographic printing member precursor comprising a first component and a second component, said first and second components being arranged to interact in areas exposed to imaging radiation for providing a surface having a first affinity for ink and one of either said first or second components being removable in non-exposed areas for providing a surface having a second affinity for ink different to said first affinity.

Suitably, only one of either said first or second components is removable in non-exposed areas. Preferably, said surface having a second affinity for ink is arranged to be defined, at least in part, by said first or second component which is not removable in non-exposed areas.

Said surface having a first affinity for ink is preferably relatively hydrophilic and/or oleophobic. Said surface having a second affinity for ink is preferably relatively oleophilic.

Said first and second components preferably include respective first and second functional groups or precursors thereof which are arranged to interact, especially to react, with one another for the formation of covalent bonds between the first and second components. Preferably, prior to said interaction said first and second components are not covalently bonded to one another. Thus, imaging radiation suitably does not break any covalent bonds between said first and second components.

Preferably, said first component includes a functional group or a functional group precursor capable of undergoing a condensation reaction with a functional group of said second component. The term "functional group precursor" includes a reference to a functional group which can be converted to another group or moiety in situ which can react as described. Said first component preferably includes one or more hydroxy groups. Said first component preferably comprises a polymer having hydroxy groups. Said polymer may comprise an inorganic polymer, for example a glass or an organic polymer for example a resin such as a phenolic resin and/or a resole resin and/or an epoxy resin and/or a hydroxypropylcellulose and/or a polyvinyl butyral and/or a polyvinyl alcohol.

Said first component preferably includes an oleophilic and/or hydrophobic moiety. It is preferably oleophilic and/or hydrophobic when in isolation.

Said second component may include a functional group or functional group precursor capable of undergoing a condensation reaction with a functional group, especially a hydroxy group, of said first component. Said functional group or precursor preferably includes a moiety—O—; it may be an hydroxy or an optionally-substituted alkoxy group. When it is an alkoxy group, the group may suitably represent a functional group precursor which may undergo an initial transformation prior to said condensation reaction.

Said second component preferably includes a hydrodhilic and/or oleophobic moiety.

Said second component may comprise an optionally-substituted siloxane or, preferably, is of general formula

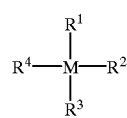

I wherein M represents a silicon or a titanium atom and each of $R^1$, $R^2$, $R^3$ and $R^4$ is independently selected from hydrogen or halogen atoms; a hydroxy group; an optionally-substituted alkyl, alkenyl or alkynyl group; an optionally-substituted alkoxy group; or an optionally-substituted saturated or unsaturated cyclic or heterocyclic group.

Unless otherwise stated in this specification, an alkyl, alkenyl or alkynyl group may have up to 20, suitably up to 10, preferably up to 8, more preferably up to 6, especially up to 4 carbon atoms with methyl, ethyl, propyl and vinyl groups being preferred; an alkoxy group may have us to 10, suitably up to 8, preferably up to 6, more preferably up to 4 carbon atoms; a saturated or unsaturated cyclic group may have up to 12, suitably up to 10, preferably up to 8, more preferably up to 6, carbon atoms and includes an aromatic group. A heterocyclic group may have 5 or 6 ring atoms.

Unless otherwise stated, where any group is stated to be "optionally-substituted" in this specification, it may be substituted by one or more: halogen atoms, especially fluorine, chlorine or bromine atoms; hydroxy or cyano groups; carboxyl groups or carboxy derivatives, for example carboxylic acid salts; and optionally-substituted alkyl, alkenyl, alkynyl, alkoxy, amino, sulphinyl, sulphonyl, sulphonate and carbonyl groups.

At least two, preferably at least three, of $R^1$, $R^2$, $R^3$ and $R^4$ includes a moiety—O— bonded to atom M.

Preferably, $R^1$ represents a hydroxy group or an optionally-substituted, especially an unsubstituted, alkoxy group.

$R^2$ may represent a hydroxy group or an optionally-substituted alkoxy, alkyl, alkenyl, cycloalkyl or phenyl group. Preferably, $R^2$ represents a hydroxy group or an optionally-substituted especially an unsubstituted, alkoxy group.

$R^3$ may represent a hydroxy group or an optionally-substituted alkoxy, alkyl, alkenyl, cycloalkyl or phenyl group. $R^3$ preferably represents a hydroxy group or an optionally-substituted alkoxy group. A preferred optionally-substituted alkoxy group may include a saturated or unsaturated carbon chain and may be substituted by a group—COOQ, where Q represents an optionally-substituted, especially an unsubstituted, alkyl group or a cationic group, especially a group $NH_4^+$.

$R^4$ may represent a group which confers hydrophilicity and/or oleophobicity on said second component. $R^4$ may represent an optionally-substituted alkoxy, alkyl, alkenyl, cycloalkyl or phenyl group. A preferred optionally-substituted alkoxy group may be as described above for group $R^3$. A preferred optionally-substituted alkyl group is substituted by a group—$S(O)_x(OH)_y$ where x and y independently represent 0, 1, 2 or 3 provided that x+y=3. Preferably, y represents 1. $R^4$ preferably represents an optionally-substituted alkoxy or alkyl group.

Where M represents a titanium atom, $R^1$ and $R^2$ preferably represent hydroxy groups and $R^3$ and $R^4$ preferably represent alkoxy groups substituted by a group —COOQ as described above.

Where M represents a silicon atom, $R^1$, $R^2$ and $R^3$ may be the same or different, preferably the same, and may represent a hydroxy group or an optionally-substituted, especially an unsubstituted, alkyl group. $R^4$ preferably represents an optionally-substituted alkyl group. In one class of compounds, $R^4$ may represent an alkyl group substituted by a group—$S(O)_x(OH)_y$, as described above. In another class of compounds, $R_4$ may represent an alkyl group substituted by a group Rf—$(Y)_m$—$(X)_n$— wherein X represents —$NR^5$— wherein $R^5$ represents a hydrogen atom or an optionally-substituted, especially an unsubstituted, alkyl group; n represents 0 or 1; Y represents an oxygen atom or a sulphinyl, sulphonyl or carbonyl group; m represents 0 or 1; and Rf represents a fluoroaliphatic group, suitably having 3 to 10 carbon atoms.

A preferred compound of general formula I where M represents a titanium atom is

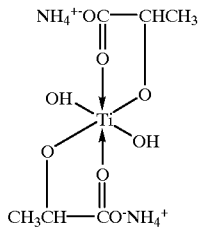

Compounds of general formula I which include a silicon atom and which fall within the scope of the present invention include chloromethylmethylsilanediol, methylvinylsilanediol, dichloromethyldimethylsilanol, chloromethyldimethylsilanol, ethylmethylsilanediol, ethoxymethylsilanediol, dimethoxymethylsilanol, trimethylsilanol, divinylsilanediol, methyl-3,3,3-trifluoropropylsilanediol, allylmethylsilanediol, dimethylvinylsilanol, 3-chloropropylmethylsilanediol, diethylsilanediol, methylpropylsilanediol, diethoxysilanediol, 3-cyanopropylmethylsilanediol, allyldimethylsilanol, 3-chloropropyldimethylsilanol, butylmethylsilanediol, dimethylpropylsilanol, dimethylisopropylsilanol, diphenylsilanediol, diallylsilanediol, 3-cyanopropyldi methylsilanol, methylpentylsilanediol, triethylsilanol, tert-butyldimethylsilanol, tri-ethoxysilanol, methylphenylsilanediol, dimethylphenylsilanol, cyclohexylmethylsilanediol, hexylmethylsilanediol, phenylvinylsilanediol, 6-methyldihydroxysilyl-2-norbornene, 2-methyldihydroxysilylnorbornene, 3-methacryloxypropylmethyl silanediol, heptylmethylsilanediol, dibutylsilanediol, allylphenylsilanediol, methylphenylvinylsilanol, 3-chloropropylphenylsilanediol, methy-β-phenethylsilanediol, benzyldimethylsilanol, 2-(4-cyclohexenylethyl)methylsilanediol, methyloctylsilanediol, tripropylsilanol, tert-butylphenylsilanediol, dimethyloctylsilanol, decylmethylsilanediol, methyldiphenylsilanol, dihexylsilanediol, tributylsilanol, diphenylmethylsilanol, dodecylmethylsilanediol, diphenylvinylsilanol, triethylsilanol, methyloctadecylsilanediol, dimethyloctadecylsilanol, tribenzylsilanol, docosylmethylsilanediol, 1,2-bis (methyldihydroxysilyl)ethane, 1,1,3,3-tetramethyl-1,3-dihydroxysiloxane, 1,2-bis (dimethylhydroxysilyl)ethane, 1,4 -bis (dimethylhydroxysilyl)benzene, 1,3 -dihydroxytetraisopropyldisiloxane, cis-(1,3,5,7-tetrahydroxy) -1,3,5,7-tetraphenylcyclotetrasiloxane, etc. Among them preferable ones are diphenylsilanediol, triphenylsilanol, and cis-(1,3,5,7-tetrahydroxy)-1,3,5,7-tetraphenylcyclotetrasiloxane.

Preferred compounds of general formula I which include a silicon atom include

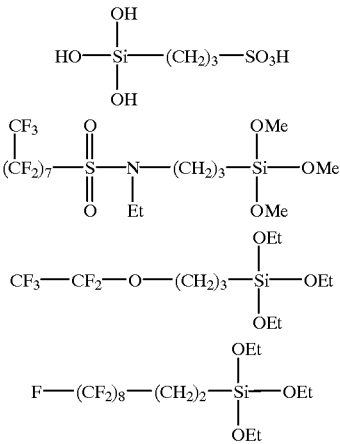

The interaction, especially the reaction, of said first and second components in exposed areas may be aided, for example by being catalysed, by a catalytic component associated with the printing member precursor. Said catalytic component may be associated with said first and/or said second components but is preferably associated with said second component. Said catalytic component or a precursor thereof may be provided by a third component which may be in intimate contact with said second component, for example by said second and third components being provided in the same layer of said precursor.

Said third component is preferably an active hydrogen compound.

Said third component may be selected from triazine, diazonium, iodonium, sulphonium, phosphonium, selenonium and arsonium compounds and salts of fluorophosphoric acid.

Preferred triazine compounds are of general formula

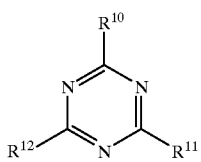

wherein $R^{10}$ represents an optionally-substituted aliphatic or aromatic group and $R^{11}$ and $R^{12}$ independently represent a haloalkyl group. An especially preferred triazine compound is 2-(4-methylthiophenyl)-4,6-trichloromethyl-S-triazine.

A preferred diazonium compound is a diazo salt, for example 4-diazodiphenylamine hexafluorophosphate. A preferred iodonium compound is diphenyliodonium iodide. A preferred sulphonium compound is an amine salt of p-toluene sulphonic acid.

Preferably, said third component is a triazine, diazonium or sulphonium compound.

Said third component may be a Lewis acid.

Said third component may be arranged to be decomposed in areas of said precursor exposed to radiation. Said third component may be decomposable on exposure to UV and/or visible and/or IR radiation and/or heat.

In some embodiments, for example when using triazines, it is believed that a said third component may decompose and generate an acid in exposed areas which can catalyse a reaction of the first and second components. Thus, in this case, said third component may be an acid generator.

Said printing member precursor may include a component for sensitising the precursor to imaging radiation, for example to infra-red, ultra-violet or visible radiation. Sensitisation suitably involves the component absorbing imaging radiation and preferably converting it to heat. Said component for sensitising may comprise said third component described above, in which case, said third component may have a dual role. Alternatively, and/or additionally, said component for sensitising may comprise a fourth component.

Where the fourth component is for sensitising to infra-red radiation, it may comprise a black body absorber such as carbon black or graphite or a commercially available pigment such as Heliogen Green as supplied by BASF, nigrosine base NG1 as supplied by NH Laboratories Inc, or Milori Blue as supplied by Aldrich; or a metal such as iron, copper, aluminium or platinum; or an organic pigment or dye such as phthalocyamine pigment or a dye or pigment of the squarylium, merocyanine, cyanine, indoliane, pyrylium or metal dithioline classes. Metals may be present as small particles, especially in the case of iron and copper, or as a film layer, especially in the case of aluminium or platinum.

Where the fourth component is for sensitising to ultra-violet radiation, it may comprise a triazine compound as described above.

Where the fourth component is for sensitising to visible radiation, it may be a titanocene compound or a ketocoumarin compound which absorbs visible radiation.

Preferably, said fourth component is in intimate contact with said first and/or said second components. Said fourth component may be provided in a layer which includes said first component or in a layer which includes said second component or in a layer which includes both said first and second components or in both a layer which includes said first component and a separate layer which includes said second component.

Said printing member suitably includes a support.

Said support may comprise a metal layer. Preferred metals include aluminium, zinc and titanium, with aluminium being especially preferred. Said support may comprise an alloy of the aforesaid metals. Other alloys that may be used include brass and steel, for example stainless steel.

Said support may comprise a non-metal layer. Preferred non-metal layers include layers of plastics, paper or the like. Preferred plastics include polyester, especially polyethylene terephthlate.

Especially preferred supports include aluminium and plastics materials.

Said support may be any type of support used in printing. For example, it may comprise a cylinder or, preferably, a plate. Said support may have a width of at least 10 cm, suitably at least 20 cm, preferably at least 30 cm, more preferably at least 40 cm, especially at least 50 cm. Said support may have a width of less than 300 cm, suitably less than 200 cm, preferably less than 160 cm, more preferably less than 100 cm, especially Less than 80 cm.

Said support may have a length of at least 20 cm, suitably at least 40 cm, preferably at least 60 cm. Said support may have a length of less than 300 cm, suitably less than 250 cm, preferably less than 200 cm, more preferably less than 150 cm, especially less than 105 cm.

Said support may have a thickness of at least 0.1 mm. Said support may have a thickness of less than 0.6 mm.

Preferably, said first or second component which is removable is present in an outermost layer of the printing member precursor. The other one of said first or second components may be present in the same layer as the component which is removable or may be present in an underlying layer which is preferably in contact with the layer in which the removable component is present.

Preferably, said second component is removable in non-exposed areas.

Said printing member precursor may comprise a first layer which includes said second component. Said first layer may also include said first component. Alternatively and/or additionally, said precursor may include a second layer which may include said first component and, preferably, said first and second layers are in intimate contact. Said fourth component may be present in said first layer and/or said second layer and/or a third layer which suitably underlies said first and/or said second layers. A preferred form of third layer is a thin metal film layer.

Said printing member precursor may comprise a said support, optionally a said third layer over the support, optionally a said second layer over the third layer, and a said first layer over the second layer and/or third layer (when provided).

Said printing member precursor may be for use in wet or dry (waterless) printing. For example, wherein said first affinity represents a hydrophilic state, said precursor may be for use in wet printing and wherein said first affinity represents an oleophobic state, said precursor may be for use in dry printing.

According to a second aspect of the present invention, there is provided a method of preparing a planographic printing member precursor, the method comprising associating a first component with a second component, suitably over a support, said first and second components being arranged to interact in areas exposed to imaging radiation for providing a surface having a first affinity for ink and one of either said first or second components being removable in non-exposed areas for providing a surface having a second affinity for ink different to said first affinity.

According to a third aspect of the present invention, there is provided a method of preparing a planographic printing member including the step of imagewise exposing a planographic printing member precursor according to said first aspect to imaging radiation.

Imaging radiation as described may comprise visible, ultra-violet or infra-red radiation or direct (e.g. conducted) heat. Radiation may be supplied by any known means, for example, imaging radiation in the form of heat may be supplied using a heated body, for example a ligated stylus. Alternatively, said radiation may be supplied using a laser for example which suitably emits in the near-IR region between 700 and 1500 nm.

Imaging radiation may be applied directly to the precursor or may be applied indirectly using a mask.

Where the precursor includes a component, for sensitising, for example a fourth component as described, said component may absorb imaging radiation and make the absorbed energy available for subsequent steps. Alternatively, said third component may itself absorb imaging radiation. The absorbed energy may be arranged to activate a catalytic effect of the third component on the interaction of the first and second components. For example, absorbed energy may cause the third component to generate an acid which may catalyse a reaction of the first and/or second components. In one embodiment, where said second component includes one or more optionally-substituted alkoxy groups, the third component may generate an acid which catalyses the hydrolysis of the alkoxy group(s), thereby facilitating reaction of the first and second components.

The method may include an optional step of blanket heating of the precursor after imagewise exposure. Such blanket heating may be arranged to facilitate the formation of covalent bonds in exposed areas. Said blanket heating may involve heating, in a conventional heating oven, to over 100° C., preferably over 120° C., more preferably 130° C. or over for at least 30 seconds, preferably at least one minute, more preferably at least two minutes, especially three minutes or more.

The method may include the step of removing one of either the first or second components in non-exposed areas. Removal may include developing the exposed precursor using physical and/or chemical means. Physical means may include the use of a roller (or the like), especially a roller used to apply fluid, especially ink, to the member during printing. Chemical means may involve use of a fluid. For example, printing ink may be used or, alternatively, a separate developing fluid may be used such as water or a silicate-based developing formulation. It will be appreciated that the precursor may be developed on press and this is preferred.

Said method may be for preparing a planographic printing member for use in wet or dry (waterless) printing.

According to a fourth aspect of the invention, there is provided a planographic printing member having printing and non-printing areas prepared in a method according to the second aspect.

Any feature of any aspect of any invention or embodiment described herein may be combined with any feature of any aspect of any other invention or embodiment described herein.

Specific embodiments of the invention will now be described, by way of example.

The following products are referred to hereinafter:

| BKR 2620 | a phenol-formaldehyde-cresol resin obtained from Georgia-Pacific Resins Inc, U.S.A. |
| --- | --- |
| Degussa FW1 | a channel-type carbon black obtained from Degussa of Macclesfield, U.K. |
| Si 285 | 3-(Trihydroxysilyl)-1-propanesulphonic acid obtained from Degussa of Macclesfield; U.K. |
| Nacure 2530 | Amine salt of p-toluene sulphonic acid obtained from K & K Greeff Ltd of England. |
| Luconyl Black 0066 | 40 wt % of carbon black in water/butyl glycol supplied by BASF Plc, Cheshire, England. |
| Tyzor LA | Dihydroxy-bis-diammonium-2-hydroxy-propanato(2)-titanate (50 wt %) in water (50 wt %) obtained from MDA Chemicals Ltd, Lancaster, England. |
| Novolac resin LB744 | a cresol-novolac resin supplied Bakelite. |

Silyl ether A solution—a 60 wt % solution in ethanol of the following obtained from 3M Industrial Chemical Division, Minnesota, U.S. (a developmental material No. L12833).

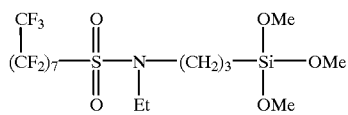

Silyl ether B solution—a 60 wt % solution in ethanol of the following obtained from Fluorochem, Glossop, U.K.

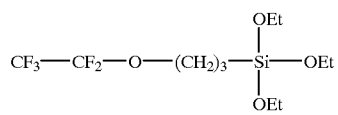

Silyl ether C solution—a 60 wt % solution in ethanol of the following obtained from Fluorochem, Glossop, U.K.

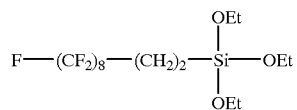

Epikote 1004 resin—a bis-phenol A epichlorohydrin resin supplied by Astor Stag Ltd of Middlesex, England.

DS019—a 4-diazonium diphenylamine paratoluene sulphonate formaldehyde condensate for acid generation, supplied by PCAS, Longjumeau, France.

IR Sensitizer I—Catalogue No. i-I-8—an IR absorbing dye, as shown below, supplied by H W Sands of Florida, U.S.A.

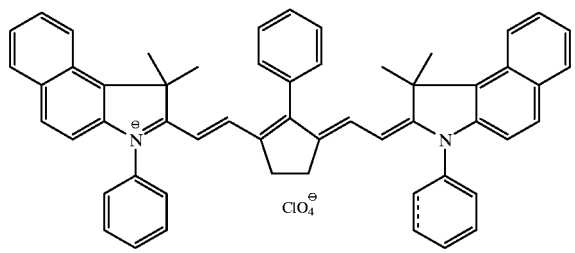

LDN1PF6 formulation—10 wt % of a 4-diazonium diphenylamine formaldehyde condensate hexafluorophosphate salt in DMF supplied by Varichem Ltd of Brynmawr, Wales.

Creo Trendsetter—refers to a Creo Trendsetter 3244 using Procomm Plus software, operating at a wavelength of 830nm at powers of up to 8W and supplied by Creo Products Inc, Burnaby, Canada.

EXAMPLE 1
Preparation of First Layer

A solution of 15% w/w BKR 2620 in 1-methoxy-2-propanol was prepared and coated onto a standard electrograined and anodized aluminium support using a Meyer bar, followed by drying at 170° C. for 10 minutes to give a dry filmweight of 3 to 4 $gm^{-2}$.

EXAMPLE 2
Preparation of (alternative) First Layer 94 wt % of the solution prepared in Example 1 was ball-milled with 6 wt % Degussa FW1 carbon black for two days in a 500 ml porcelain ball mill using porcelain balls. The final particle size of the carbon black was about 2 μm as measured using a Hegman/Grind gauge. The solution prepared was then coated as described in Example 1.

EXAMPLES 3 to 14
Preparation of Printing Plate Precursors

The components shown in Table 1 below were barrel-rolled together for 24 hours. Each formulation was applied using a Meyer bar over the first layer of a respective arrangement of Example 2 followed by drying at 55° C. for two minutes to give a dry filmweight of 3 to 4 $gm^{-2}$. Formulations 5 to 8 were applied in a similar manner over the first layer of a respective arrangement of Example 1. A summary of the make-up of the plate precursors of Examples 3 to 14 is provided in Table 2.

TABLE 1

| Formulation No. | Si 285 wt % | Nacure 2530 wt % | Methanol wt % | Luconyl Black 0066 wt % | % acid (Nacure) on Si 285 solids |
|---|---|---|---|---|---|
| 1 | 30.0 | 0 | 70.0 | — | 0 |
| 2 | 29.3 | 1.5 | 69.2 | — | 2.5 |
| 3 | 28.6 | 2.9 | 68.5 | — | 5 |
| 4 | 27.3 | 5.5 | 67.2 | — | 10 |
| 5 | 25.5 | 0 | 59.5 | 15 | 0 |
| 6 | 24.9 | 1.3 | 58.8 | 15 | 2.5 |
| 7 | 24.3 | 2.5 | 58.2 | 15 | 5 |
| 8 | 23.2 | 4.7 | 57.1 | 15 | 10 |

TABLE 2

| Example No. | Identity of first layer (as per example 1 or 2) | Formulation No. used |
|---|---|---|
| 3 | 2 | 1 |
| 4 | 2 | 2 |
| 5 | 2 | 3 |
| 6 | 2 | 4 |
| 7 | 2 | 5 |
| 8 | 2 | 6 |
| 9 | 2 | 7 |
| 10 | 2 | 8 |
| 11 | 1 | 5 |
| 12 | 1 | 6 |
| 13 | 1 | 7 |
| 14 | 1 | 8 |

EXAMPLES 15 and 16
Preparation of Further Printing Plate Precursors

Respective formulations 9 and 10 described in Table 3 were coated over arrangements prepared as described in Example 2 using a Meyer bar followed by drying at 60° C. for 3 minutes to give a dry filmweight of 3 to 4 $gm^{-2}$.

TABLE 3

| Formulation No. | Si 285 wt % | Nacure 2530 wt % | Luconyl Black 0066 wt % | Methanol wt % |
|---|---|---|---|---|
| 9 | 28.6 | 2.9 | — | 68.5 |
| 10 | 24.3 | 2.5 | 15 | 58.2 |

EXAMPLE 17
Preparation of Further Printing Plate Precursor

Tyzor LA (30 wt %) and methanol (70 wt %) were barrel-rolled together until intimately mixed and the formulation was applied over the first layer of an arrangement prepared as described in Example 2 followed by drying at 100° C. for 10 minutes to give a dry filmweight of 3 to 4 $gm^{-2}$.

EXAMPLE 18
Imaging (1st Method)

The plates of Examples 3 to 17 were cut into discs of 105 mm diameter and placed on a rotatable disc that could be rotated at a constant speed between 100 and 2500 revolutions per minute. Adjacent to the rotatable disc, a translating table held a laser beam source so that it impinged normal to the disc, while the translating table moved the laser beam radially in a linear fashion with respect to the rotatable disc. The exposed image was in the form of a spiral whereby the image in the centre of the spiral represented slow laser scanning speed and long exposure time and the outer edge of the spiral represented fast scanning speed and short exposure time.

The laser used was a single mode 830 nm wavelength 200mW laser diode which was focused to a 10 micron spot. The laser power supply was a stabilised constant current source.

EXAMPLE 19
Imaging (2nd Method)

The plates of Examples 15 and 16 were cut into strips no smaller than 460×300 mm and imaged at 220 to 400 $mJcm^{-2}$ in 40 $mJcm^{-2}$ increments, using the Creo Trendsetter, to give a total of eight strips. After imaging, the eight strips could be distinguished on a plate before and after washing in water by a change in gloss.

EXAMPLE 20
Inking 0.6 to 0.7g of conventional air drying offset lithographic printing ink was applied to an area of glass plate 15 cm×20 cm in size and this was rolled into a uniform film using a rubber roller. A plate to be inked was rinsed in alcohol containing fountain solution and wiped using cotton wool to remove any debris. A thin film of fountain solution was left on the plate. The plate was inked using several passes of the inked rubber roller and the plate then rinsed in water to remove excess ink. Offset prints were taken by applying the inked face of the plate to a compressible lithographic blanket and rolled over with the roller. The plate was then removed and a piece of paper put in its place. The image was then transferred to the paper by rolling over with the rubber roller. The test was a success if a copy of the image originally on the plate was present on the paper.

Results

It was found that plates described in Examples 3 to 17 could be imaged and inked as described in Examples 18 to 20 and offset prints successfully taken.

EXAMPLES 21 to 36

Preparation and Assessment of Further Plate Precursors

In each of Examples 21 to 36, a support having dimensions 10 cm×20 cm×0.3 mm was used, unless otherwise stated.

EXAMPLE 21

The following components were mixed for 15 minutes prior to coating, using a metered wire bar, onto a piece of anodized, ungrained aluminium, followed by drying at 100° C. for 1 minute:

a solution comprising 1.2g Novolak resin LB744 (10 wt %) in 1-methoxypropan-2-ol (90 wt %);

0.46g of a solution of 2-(4-methylthiophenyl)-4,5-trichloromethyl-S-triazine (3 wt %) in 2-methoxyethylacetate supplied by Lancaster Synthesis, Morecambe, England; and 0.12g of silyl ether A solution.

EXAMPLES 22 to 24

Plates were prepared as described in Example 21, except that the solution comprising Novolak resin LB744 and 1-methoxypropan-2-ol was substituted with the following:

Example 22—a 10 wt % solids solution of hydroxypropyl cellulose (ex. Aldrich Chemical Company, Dorset, England) in 1-methoxy-propan-2-ol;

Example 23—a 10 wt % solids solution of poly (vinylbutyral) (ex. Hoechst UK Ltd, Middlesex, England) in 1-methoxy-propan-2-ol;

Example 24—a 10 wt % solids solution of Epikote 1004 resin in a solvent mixture of 9 parts methyl lactate to 1 part benzyl alcohol.

EXAMPLES 25 and 26

Plates were prepared as described in Examples 21 and 23 but using grained and anodized aluminium, Each of the precursors of Examples 21 to 26 was exposed to UV radiation through a mask and heated in an oven at 130° C. for 3 minutes. After cooling, the plates were inked up with a rubber roller and waterless ink to give a positive plate with clean release and strongly inked image areas.

EXAMPLE 27

The following components were mixed for 15 minutes prior to coating, using a metered wire bar, onto a piece of anodized, ungrained aluminium, followed by drying at 100° C. for 1 minute:

0.6 g of a formulation comprising:
  0.6 g of a 25% solids solution Epikote 1004 in a solvent mixture of 9 parts methyl lactate to 1 part benzyl alcohol;
  0.3 g DS019; and
  2.6 g of a 9:1 mixture of methyl lactate and benzyl alcohol (hereinafter "formulation 11") and
0.06 g of silyl ether A solution.

The resultant plate was exposed to UV radiation through a mask and then heated in an oven at 130° C. for 80 seconds. After cooling the plate was inked up using a rubber roller and waterless ink to give a positive plate with a clean release and strongly inked image area.

EXAMPLE 28

The following components were mixed for 15 minutes prior to coating, using a metered wire bar, on to a piece of anodized, ungrained aluminium, followed by drying at 100° C. for 1 minute:

0.6 g of formulation 11 of Example 27;
0.18g of a mixture comprising 3.2 wt % IR Sensitizer I in dimethyl formamide; and
0.06 g of silyl ether A solution.

The coated aluminium was divided into two halves referred to hereinafter as "A" and "B". "A" was exposed to IR light imagewise using a laser and "B" was imaged using UV light and mask. Both were heated in an oven at 130° C. for 80 seconds and then inked up using a rubber roller and waterless ink to yield positive plates. No processing was used. It was noted that the presence of the IR sensitiser did not affect the sensitivity of the plate to UV exposure.

EXAMPLE 29

A plate was prepared as described in Example 27 and exposed to UV radiation through a mask, followed by heating in an oven at 130° C. for 80 seconds. The plate was developed for 30 seconds using water. After drying, the plate was inked to yield a positive plate.

EXAMPLES 30 and 31

Respective compositions comprising 0.6 g of formulation 11 of Example 27 and 0.04 g of silyl ether solution B (Example 30) or silyl ether solution C (Example 31) were mixed for 15 minutes prior to coating, using a metered wire bar, on grained and anodized aluminium followed by drying at 100° C. for 1 minute.

The plate precursors were exposed to UV radiation through a mask, then heated in an oven at 130° C. for 180 seconds. The resultant plates each gave good image/background discrimination on inking without the need for water.

EXAMPLE 32

The components described below were mixed for 15 minutes prior to coating, using a metered wire bar, onto aluminium, followed by drying at 100° C. for 60 seconds:

0.25 g of a 10 wt % solids solution of Epikote 1004 in a solvent mixture comprising 9 parts methyl lactate to 1 part benzyl alcohol;
0.19 g of LDN1PF6 formulation; and
0.06 g silyl ether A solution.

The plate precursor was exposed to UV radiation through a mask and then heated at 100° C. for 1 minute. The resultant plate, on inking, gave good image/non-image discrimination without the need for dampening water.

EXAMPLE 33

Formulation 11 (Example 27) was coated onto grained and anodized aluminium using a metered wire bar and dried at 100° C. for 1 minute. This was then overcoated with a composition comprising silyl ether A solution diluted with cyclohexane to provide a solution comprising 6 wt % of silyl ether A (hereinafter "formulation 12").

The plate precursor was exposed through a mask to UV light and then heated at 130° C. for 80 seconds. Good image/non-image discrimination was seen on inking without the use of dampening solution.

EXAMPLE 34

A formulation (hereinafter "formulation 13") was prepared by ball-milling the following:

- 0.34 g of carbon black Degussa FW1;
- 0.66 g of Epikote 1004 resin;
- 3.60 g of methyl lactate; and
- 0.4 g benzyl alcohol.

Then, the following formulation was coated, using a metered bar, onto grained and anodized aluminium, followed by drying at 100° C. for 1 minute:

- 0.75 g of formulation 13;
- 0.3 g of DSO19;
- 0.67 g of dimethyl formamide; and
- 1.38 g of 9:1 methyl lactate: benzyl alcohol.

The aforementioned was overcoated with formulation 12 (Example 33) and dried at 100° C. for 30 seconds. The plate precursor was imaged using a 200 mW, 850 mm laser and baked at 130° C. for 80 seconds. The plate was developed and inked by applying waterless ink with a roller to give good image discrimination, without the need for dampening solution.

EXAMPLE 35 and 36

Formulation 11 (Example 27) was coated onto the metallized side of an aluminized polyester sheet (supplied by HiFi Industrial Film Limited, Stevenage, England) (Example 35) or a polyester sheet (supplied as PLANFOIL by Horsell Graphic Industries Limited) sputter coated for 3 minutes using a Fisons instrument Model SC510 SEM coating system with an Argon plasma at 10 Pa.atm with 20 mA plasma current to provide a thin layer of aluminium (Example 36), followed by drying at 100° C. for 1 minute and subsequent overcoating with formulation 12 (Example 33), followed by drying at 100° C. for 30 seconds.

The plate precursors prepared were imaged using a 200 mW 830 nm laser and baked at 130° C. for 80 seconds. On inking using waterless ink and a roller with no dampening solution applied, positive plates were produced with good image/non-image discrimination.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. A planographic printing member precursor comprising a first component and a second component, said first and second components being arranged to interact in areas exposed to imaging radiation for providing a surface having a first affinity for ink and only one of either said first or second components being removable in non-exposed areas for providing a surface having a second affinity for ink different to said first affinity, wherein said first component includes one or more hydroxy groups, and said second component comprises one of the following: (i) a compound of the general formula

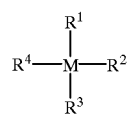

I wherein M represents a silicon or titanium atom, with the proviso that when M represents a titanium atom, $R^1$ and $R^2$ represent hydroxy groups and $R^3$ and R4 represent alkoxy groups substituted by a group—COOQ wherein Q represents an optionally substituted alkyl group or a cationic group, and when M represents a silicon atom, $R^1$, $R^2$ and $R^3$ independently represent a hydroxy group or an optionally-substituted alkyl group, and $R^4$ represents an optionally-substituted alkyl group; or (ii) a compound selected from the group consisting of

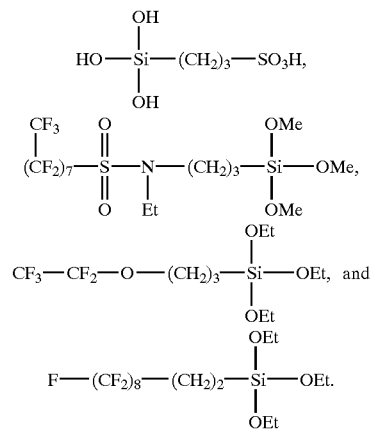

2. A precursor according to claim 1, wherein said surface having a second affinity for ink is arranged to be defined, at least in part, by said first or second component which is not removable in non-exposed areas.

3. A precursor according to claim 1, wherein said first component includes a functional group or a functional group precursor capable of undergoing a condensation reaction with a functional group of said second component.

4. A precursor according to claim 1, wherein said first component comprises a polymer having hydroxy groups.

5. A precursor according to claim 1, wherein said first component includes an oleophilic and/or hydrophobic moiety.

6. A precursor according to claim 1, wherein said second component includes a functional group or functional group precursor capable of undergoing a condensation reaction with a functional group of said first component, wherein said functional group or precursor includes a moiety—O—.

7. A precursor according to claim 1, wherein said second component includes a hydrophilic and/or oleophobic moiety.

8. A precursor according to claim 1, wherein the interaction of said first and second components in exposed areas is aided by a catalytic component, provided by a third component which is an active hydrogen compound.

9. A precursor according to claim 8, wherein said third component is a triazine, diazonium or sulphonium compound.

10. A precursor according to claim 1, including a component for sensitising the precursor to imaging radiation.

11. A precursor according to claim 1, wherein said first or second component which is removable is present in an outermost layer of the printing member precursor.

12. The precursor of claim 1, in which the precursor comprises a support, a bottom layer comprising the first component applied to the support, and a top layer comprising the second component applied to the bottom layer.

13. The precursor of claim 12, in which the bottom layer is ink-accepting, and the top layer is hydrophilic.

14. The precursor of claim 12, in which the bottom layer is ink-accepting and the top layer is oleophobic.

15. The precursor of claim 1, in which the precursor comprises a support, a bottom layer comprising the second component applied to the support, and a top layer comprising the first component applied to the bottom layer.

16. A method of preparing a planographic printing member including the step of imagewise exposing a planographic printing member precursor according to claim 1 to imaging radiation.

17. A method according to claim 16, including an optional step of blanket heating of the precursor after imagewise exposure.

18. A planographic printing member having printing and non-printing areas prepared in a method according to claim 16.

19. A method of preparing a planographic printing member precursor, the method comprising associating a first component which includes one or more hydroxy groups with a second component, suitably over a support, said first and second components being arranged to interact in areas exposed to imaging radiation for providing a surface having a first affinity for ink and only one of either said first or second components being removable in non-exposed areas for providing a surface having a second affinity for ink different to said first affinity, wherein the second component comprises one of the following: (i) a compound of the general formula

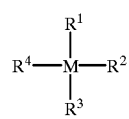

I wherein M represents a silicon or titanium atom, with the proviso that when M represents a titanium atom, $R^1$ and $R^2$ represent hydroxy groups and $R^3$ and $R^4$ represent alkoxy groups substituted by a group—COOQ wherein Q represents an optionally substituted alkyl group or a cationic group, and when M represents a silicon atom, $R^1$, $R^2$ and $R^3$ independently represent a hydroxy group or an optionally-substituted alkyl group, and $R^4$ represents an optionally-substituted alkyl group; or (ii) a compound selected from the group consisting of

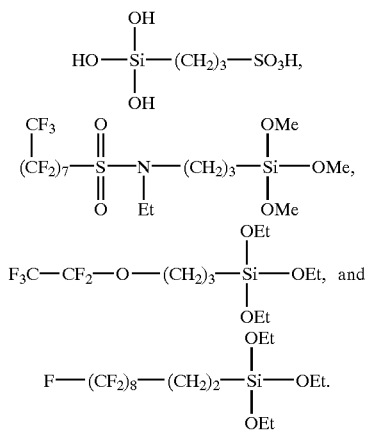

* * * * *

UNITED STATES PATENT AND TRADEMARK OFFICE
CERTIFICATE OF CORRECTION

PATENT NO. : 6,399,271 B1
DATED : June 4, 2002
INVENTOR(S) : Ray et al.

It is certified that error appears in the above-identified patent and that said Letters Patent is hereby corrected as shown below:

Column 1,
Line 21, "oleopohilic" should read -- oleophilic --
Line 25, "ink." should read -- ink --
Line 28, "numerous-known" should read -- numerous known --

Column 2,
Line 25, "hydrodhilic" should read -- hydrophilic --
Line 46, "us" should read -- up --

Column 4,
Line 2, "3-cyanopropyldi methylsilanol," should read
-- 3-cyanopropyldimethylsilanol, --
Line 8, "3-methacryloxypropylmethyl silanediol," should read
-- 3-methacryloxypropylmethylsilanediol, --

Column 5,
Line 46, "phthalocyamine" should read -- phthalocyanine --
Line 47, "indoliane" should read -- indoline --

Column 6,
Line 5, "terephthlate" should read -- terephthalate --
Line 14, "Less" should read -- less --

Column 9,
Line 1, "830nm" should read -- 830 nm --

Column 10,
Line 52, "200mW" should read -- 200 mW --

Column 11,
Lines 30 and 40, "Novolak" should read -- novolac --

UNITED STATES PATENT AND TRADEMARK OFFICE
CERTIFICATE OF CORRECTION

PATENT NO. : 6,399,271 B1
DATED : June 4, 2002
INVENTOR(S) : Ray et al.

It is certified that error appears in the above-identified patent and that said Letters Patent is hereby corrected as shown below:

<u>Column 14,</u>
Line 35, "R4" should read -- $R^4$ --
Lines 40 and 41, "optionally-substituted" should read -- optionally substituted --

<u>Column 16,</u>
Lines 26-27, "optionally-substituted" should read -- optionally substituted --
Lines 27-28, "optionally-substituted" should read -- optionally substituted --

Signed and Sealed this

Fourteenth Day of January, 2003

JAMES E. ROGAN
*Director of the United States Patent and Trademark Office*